(12) United States Patent
Kimura et al.

(10) Patent No.: US 7,491,972 B1
(45) Date of Patent: Feb. 17, 2009

(54) POLYSILICON SEMICONDUCTOR THIN FILM SUBSTRATE, METHOD FOR PRODUCING THE SAME, SEMICONDUCTOR DEVICE, AND ELECTRONIC DEVICE

(75) Inventors: Yoshinobu Kimura, Tokyo (JP); Takahiro Kamo, Mobara (JP); Yoshiyuki Kaneko, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 1020 days.

(21) Appl. No.: 10/019,407

(22) PCT Filed: Jun. 23, 2000

(86) PCT No.: PCT/JP00/04141

§ 371 (c)(1),
(2), (4) Date: Mar. 25, 2002

(87) PCT Pub. No.: WO01/01464

PCT Pub. Date: Jan. 4, 2001

(30) Foreign Application Priority Data

Jun. 28, 1999 (JP) .................................. 11/181559

(51) Int. Cl.
*H01L 21/00* (2006.01)
(52) U.S. Cl. .............................. 257/64; 257/79; 257/72
(58) Field of Classification Search ................ 438/166, 438/151, 308, 270, 268, 197, 198, 931; 257/328, 257/330, 339, 77, 347, 349, 350, 190, 94, 257/97, 69, 74, 72; 359/354
See application file for complete search history.

(56) References Cited

U.S. PATENT DOCUMENTS 5,581,102 A * 12/1996 Kusumoto .................. 257/347
5,714,404 A * 2/1998 Mitlitsky et al. .............. 438/94
5,893,730 A * 4/1999 Yamazaki et al. ........... 438/166
5,915,180 A * 6/1999 Hara et al. .................. 438/270

(Continued)

FOREIGN PATENT DOCUMENTS

JP 8-139334 5/1996

(Continued)

OTHER PUBLICATIONS

SID 96 Digest, pp. 17-20.

(Continued)

*Primary Examiner*—Laura M Menz
(74) *Attorney, Agent, or Firm*—Antonelli, Terry, Stout & Kraus, LLP.

(57) ABSTRACT

A semiconductor device and a method of manufacture thereof by forming an amorphous semiconductor film on the surface of an insulative substrate, and irradiating the amorphous semiconductor film with a laser beam to crystallize it to form a polycrystalline semiconductor thin film. A transistor is then formed in the polycrystalline semiconductor thin film. More specifically, a UV-ray is irradiated to the rear face of the insulative substrate or the amorphous semiconductor film to heat the amorphous semiconductor film to a melting temperature or lower. Then a laser beam at a suitable shape selection laser energy density Ec forms the crystal grains with the number of closest crystal grains of 6 most predominantly being irradiated to convert the amorphous semiconductor film into a polycrystalline semiconductor thin film. The thin film transistor formed in this structure has a high yield and is capable of high-speed operation.

6 Claims, 16 Drawing Sheets

U.S. PATENT DOCUMENTS

| | | | |
|---|---|---|---|
| 6,096,434 A * | 8/2000 | Yano et al. | 428/446 |
| 6,172,380 B1 * | 1/2001 | Noguchi et al. | 257/64 |
| 6,493,127 B2 * | 12/2002 | Gopalakrishnan | 359/254 |
| 6,649,824 B1 * | 11/2003 | Den et al. | 136/256 |
| 2005/0271952 A1 * | 12/2005 | Jung | 430/5 |

FOREIGN PATENT DOCUMENTS

| | | |
|---|---|---|
| JP | 11-145056 | 5/1999 |
| JP | 11204440 A * | 7/1999 |
| JP | WO 0101464 A * | 1/2001 |

OTHER PUBLICATIONS

IEEE Transactions on Electron Devices, vol. 43, No. 9, Sep. 1996, pp. 1454-1458.

Appl. Phys. Lett. 63(14), Oct. 4, 1993, pp. 1969-1971.

Proceedings of the Institute of Electronics, Information and Communication Engineers C-II vol. J76-C-II, 1993, pp. 241-248.

* cited by examiner (a)

(b)

(c)

(a)

(b)

(a)

(b)

(c)

(a)

(b)

(a)

(b)

POLYSILICON SEMICONDUCTOR THIN FILM SUBSTRATE, METHOD FOR PRODUCING THE SAME, SEMICONDUCTOR DEVICE, AND ELECTRONIC DEVICE

TECHNICAL FIELD

The present invention relates to a polycrystalline semiconductor thin film substrate, a manufacturing method thereof, a semiconductor device, a method of manufacturing a semiconductor device and an electronic apparatus and, more in particular, it relates to a technique which is effective to application use for manufacturing a transistor (thin film transistor: TFT) in a surface layer portion of a polycrystalline film (polycrystalline semiconductor thin film) and a manufacturing technique of a polycrystalline semiconductor thin film substrate for manufacturing the thin film transistor, as well as an electronic apparatus incorporated with the thin film transistor such as a liquid crystal display or data processor.

BACKGROUND ART

Thin film transistors (TFT) used for image displays in the prior art have been formed using, as a device material, polycrystalline silicon formed by a melting recrystallization method such as excimer laser annealing from amorphous silicon or microcrystalline silicon formed by a plasma CVD process on an insulative substrate such as glass or quartz as a base material.

The semiconductor device (TFT) and the manufacturing method thereof in the prior art are to be described with reference to FIG. 17(a) to (d). As shown in FIG. 17(a), an amorphous silicon thin film 202 is deposited on one surface of a glass substrate 201.

Then, as shown in FIG. 17(b), when the surface of the amorphous silicon thin film 202 is scanned by a linear excimer laser beam 204 in the direction of an arrow 203, the amorphous silicon thin film 202 is heated by the excimer laser beam 204 and changed from an amorphous structure into a polycrystalline structure. When the entire surface of the amorphous silicon film 202 is heated by the excimer laser beam 204 under scanning, a polycrystalline silicon thin film 205 is formed as shown in FIG. 17(c). In FIG. 17(c), the polycrystalline silicon thin film 205 is made of silicon crystal grains and a grain boundary 206 is formed between the crystal grains.

The process described above is referred to as a laser heating process. This is adopted when a polycrystalline silicon thin film at high quality is prepared on a substrate comprising a low melting material such as glass. They are described in details, for example, in "1996 Society for Information Display International Symposium Digest of Technical Papers, pp 17-29" and "IEEE Transactions on Electron Devices, vol. 43, No. 9, 1996, pp 1454 to 1458" and the like.

FIG. 17(d) shows a transistor (TFT) formed by using the polycrystalline silicon thin film in FIG. 17(c).

A gate insulation film 208 such as a silicon oxide film is disposed on the polycrystalline silicon thin film 205. Further, a source impurity implantation region 207 and a drain impurity implantation region 209 are formed on the polycrystalline silicon thin film 205. A thin film transistor is formed by disposing a gate electrode on the source-impurity implantation regions 207 and 209 and the gate insulation film 208.

FIG. 18 shows the dependence of the size of the silicon crystal grain and the roughness of the polycrystalline silicon thin film on the irradiation laser energy in the prior art (dependence 301 of the size of the crystal grain on the laser energy density). Silicon is not crystallized at the energy with a laser energy density of 200 mJ/cm$^2$ or less but crystallization initiates when it exceeds 200 mJ/cm$^2$ and the size of the crystal grain increases along with an increase in the laser energy density.

However, when the laser energy density exceeds 250 mJ/cm$^2$, the silicon crystal grain becomes smaller. Since a polycrystalline silicon thin film transistor having favorable characteristics may be manufactured by increasing the size of the silicon crystal grains, the energy density of the laser is set to 250 mJ/cm$^2$.

The value of the laser energy density in the prior art may sometimes vary since it depends on the nature of the amorphous silicon film (for example, growing method, film thickness). They are described in details, for example, in "Applied Physics Letters, vol. 63, No. 14, 1993, pp 1969-1971".

Further, for increasing the grain diameter of the crystal grains, laser irradiation may preferably be conducted by heating the substrate at 400° C. This is because the solidification velocity is lowered by heating the substrate and the grain diameter increases up to about 500 nm. Further, since a temperature gradient is caused at the end of the laser beam, the size of the crystal grains varies remarkably. In order to prevent this, laser may be preferably irradiated under overlapping. They are reported in "Proceedings of The Institute of Electronics, Information and Communication Engineers C-II Vol. J76-C-II, 1993, pp 241-248".

Further, for making the size of the crystal grains uniform, first laser irradiation is applied at first at a low energy density and, subsequently, a second laser irradiation is applied at a high energy density required for crystallization. Such a two-step laser irradiation is applied for forming crystal seeds by the first laser irradiation and crystallization of them by the second laser irradiation. In this case, while the uniformess is improved, the crystal grain diameter is reduced. This is reported in "Proceedings of 42th Laser Materials Processing Conference, 1997, pp. 121-130".

DISCLOSURE OF THE INVENTION

It has been found that the prior art described above involves the following problems.

When many grain boundaries are present in a silicon channel region under a gate electrode, non-uniformess thereof may sometimes lower the carrier mobility μ to several cm$^2$/V·s, for example, due to the variation of conduction carriers.

Further, when the grain boundaries present in the silicon channel region under the gate electrode varies in density, a threshold voltage $V_{th}$ varies up to several V in individual transistors.

In addition, when the crystal grain in the silicon channel region under the gate electrode varies in size, individual transistors vary in carrier mobility μ.

Further, when roughness of the grain boundaries is present in the silicon channel region under the gate electrode, individual transistors vary and degrade in performance.

Further, when impurities are implanted in the polycrystal region, since impurities segregate in the grain boundaries, it is difficult to control the carrier concentration.

The present inventors have made observation and studies on the distribution of crystal grains of polycrystal semiconductor thin films manufactured in the prior art. FIG. 19 shows the arrangement of crystal grains of the polycrystalline semiconductor thin film in the existent polycrystalline semiconductor thin film substrate used for the manufacture of thin film transistors.

This figure is based on microscopic photography and crystal grains 250 are in various shapes such as trigonal, tetragonal, pentagonal, hexagonal, heptagonal and octagonal shapes, in which hexagonal crystal grains 251 are most predominant. It has been found that the number of the hexagonal grains 251 is about 30 to 40%. A square region of 10 μm side is taken as an evaluation region and observation was made at an optional place.

The present inventors have considered that the crystal grains can be unified in the polycrystal semiconductor thin film, that is, the characteristics of the thin film transistor can be improved and unified by decreasing the number of trigonal, square and pentagonal shapes and increasing the number of hexagonal crystal grains by so much.

Then, when a relation between the energy density of the laser irradiated to the amorphous silicon film and the shape of the crystal grains formed was examined, it has been found that there exists a laser energy density on every shape that maximizes the formation of each shape (suitable shape selection laser energy density Ec). That is, it has been found that there exist laser energy density that maximizes formation of the tetragonal shape, the laser energy density that maximizes formation of the pentagonal shape and the laser energy density that maximizes formation of the hexagonal shape.

This invention is an invention adopting a crystallization method based on the suitable shape selection laser energy density Ec by the finding described above, which defines the crystal grains in the polycrystalline semiconductor thin film as the hexagonal shape and defines the rate of the hexagonal shape to be 50-100%.

An object of this invention is to provide a polycrystalline semiconductor thin film in which the size of the crystal grains and the carrier concentration are uniform and which has a planar surface.

Another object of this invention is to provide a semiconductor device having a thin film transistor with favorable characteristics and with less variation in characteristics.

A further object of this invention is to provide an electronic apparatus with favorable characteristics incorporated with a semiconductor device having a thin film transistor.

The foregoing and other objects, as well as novel features of this invention will become apparent with reference to the descriptions of the specification and the appended drawings.

Outline of typical inventions among those disclosed in the present application will be described simply as below.

The means (1) described above provides a polycrystal semiconductor thin film substrate comprising an insulative substrate and a polycrystalline semiconductor thin film disposed on one surface of the insulative substrate, in which 50-100% of the crystal grains forming the polycrystalline semiconductor thin film are of a hexagonal shape. Electron orbits of the crystal grains at the surface and inside the polycrystalline semiconductor thin film are bonded to each other. The roughness of the grain boundaries on the surface of the polycrystalline semiconductor thin film is 5 nm or less. The insulative substrate is a glass substrate and the polycrystalline semiconductor thin film is a polycrystalline silicon film.

Such a polycrystalline semiconductor thin film substrate is manufactured by the following method. In a method of manufacturing a polycrystalline semiconductor thin film substrate by forming an amorphous semiconductor film on the surface of an insulative substrate, then irradiating the amorphous semiconductor film with a laser beam to crystallize the amorphous semiconductor film to form a polycrystalline semiconductor thin film, a UV-ray is irradiated to the rear face of the insulative substrate or to the amorphous semiconductor film thereby to heat the amorphous semiconductor film to a melting temperature or lower, and a laser beam at a suitable shape selection laser energy density Ec which maximizes formation of the crystal grains hexagonal shape is irradiated repeatedly to the surface of the amorphous semiconductor film, thereby converting it into the polycrystalline semiconductor thin film.

After repeating a first laser irradiation for multiple cycles at the suitable shape selection laser energy density Ec to the surface of the amorphous semiconductor film, a second laser irradiation is repeated for multiple cycles at an energy density lower than that of the laser energy density Ec. The first laser irradiation and the second laser irradiation are conducted while scanning the laser beam along the surface of the amorphous semiconductor film. The irradiation is conducted while synchronizing the period of the laser beam irradiation and the period of the UV-ray heating. The laser beam irradiation is conducted by an excimer laser and the laser beam emitted from the excimer laser is divided by an optical component into two optical channels, such that one of them reaches a laser beam irradiation position with a delay and the laser beam passing through a shorter optical channel length is attenuated by being passed through an optical attenuator and caused to reach the laser beam irradiation position, thereby forming the polycrystalline semiconductor thin film.

(2) A semiconductor device in which plural transistors are formed to a polycrystalline semiconductor thin film wherein the transistor (thin film transistor) is formed to a polycrystal semiconductor thin film of the constitution (1) described above.

The semiconductor device as described above is manufactured by the following method. It is manufactured by a method of manufacturing a semiconductor device by forming plural transistors in a polycrystalline semiconductor thin film wherein the polycrystalline semiconductor thin film has the constitution (1) described above.

(3) An electronic apparatus incorporating a semiconductor device in which plural transistor are formed in a polycrystal semiconductor thin film, wherein the semiconductor device is made up with the semiconductor device of the constitution (2) described above. For example, the electronic apparatus is a liquid crystal display, and the semiconductor device has transistors for operating each of pixels of a liquid crystal display panel and transistors constituting the peripheral driver circuitries and is attached being overlapped to a liquid crystal display panel of the liquid crystal display.

(4) An electronic apparatus incorporating a semiconductor device in which plural transistors are formed in a polycrystalline semiconductor thin film, wherein the electronic apparatus is, for example, a data processor in which a central processing unit, a cache circuitry, a memory circuitry, a peripheral circuitry, an input/output circuitry and a bus circuitry are formed with each of the transistors of the semiconductor device.

According to the constitution (1) described above, (a) since 50 to 100% of the crystal grains in the polycrystalline semiconductor thin film comprise hexagonal crystal grains and the grain diameter is uniform as from 0.2 to 0.3 μm, a substrate with improved carrier mobility μ and with less variation in the carrier mobility μ in each of the regions can be provided.

(b) Since the electron orbits of the grain boundaries at the surface and inside the polycrystalline semiconductor thin film are bonded to each other, it is possible to provide an effect of making the carrier mobility constant and improving the reliability of individual transistors. That is, longer life can be attained for individual transistors.

(c) Since the laser beam is irradiated repeatedly upon formation of the polycrystalline semiconductor thin film, roughness on the surface of the polycrystalline semiconductor thin film can be reduced to provide a planar polycrystalline semiconductor thin film substrate.

(d) Since laser beam irradiation is conducted repeatedly by multiple cycles at the suitable shape selection laser energy density Ec most preferred for forming the hexagonal shape, hexagonal shape crystals are formed successively in the amorphous semiconductor film, adjacent hexagonal crystal grains move to each other and are gradually in close contact with adjacent hexagonal crystal grains. Subsequently, since laser beam irradiation is conducted repeatedly for multiple cycles at a laser energy density lower than the suitable shape selection energy density Ec, less impurities less-segregate to the grain boundaries to make the carrier concentration of the crystal grains constant.

According to the constitution (2) described above, (a) since 50 to 100% of the crystal grains comprise hexagonal crystal grains and the grain size thereof is uniform as 0.2 to 0.5 μm in the polycrystalline semiconductor thin film, when a transistor (TFT) is formed, the grain boundaries are reduced in the silicon channel region under the gate electrode, the carrier mobility μ is improved and variation in the carrier mobilities is decreased in each of the transistors.

(b) In each of the transistors, the density of the grain boundaries present in the silicon channel region below the gate electrode varies less and the threshold voltage $V_{th}$ is made uniform in each of the transistors.

(c) Since the laser beam is irradiated repeatedly upon forming the polycrystalline semiconductor thin film, roughness on the surface of the polycrystalline semiconductor thin film is reduced and variation in the performance of individual transistors is reduced and less degradation occurs to attain the longer life of the transistors.

(d) In the formation of the polycrystalline semiconductor thin film, since laser beam irradiation is conducted repeatedly for multiple cycles at the suitable shape selection laser energy density Ec most preferred for forming the hexagonal shape, hexagonal seed crystals are formed successively in the amorphous semiconductor film, adjacent hexagonal crystal grains move to each other and are gradually in close contact with adjacent hexagonal crystal grains. Subsequently, since laser beam irradiation is conducted repeatedly for multiple cycles at a laser energy density lower than the suitable shape selection energy density Ec, less impurities segregate to the grain boundaries to make the carrier concentration of the crystal grains constant. As a result characteristics of the transistors become stable.

According to the constitutions (3) described above, since each of plural transistors for operating each of pixels on the liquid crystal display panel is made uniform in the characteristics, image at high quality can be obtained.

According to the constitution (4) described above, since the central processing unit, the cache circuitry, the memory circuitry, the peripheral circuitry, the input/output circuitry and the bus circuitry are formed with the thin film transistors formed on the glass substrate surface, it is possible to provide a data processor of reduced thickness and higher performance.

BEST MODE FOR CARRYING OUT THE INVENTION

Figure 1:
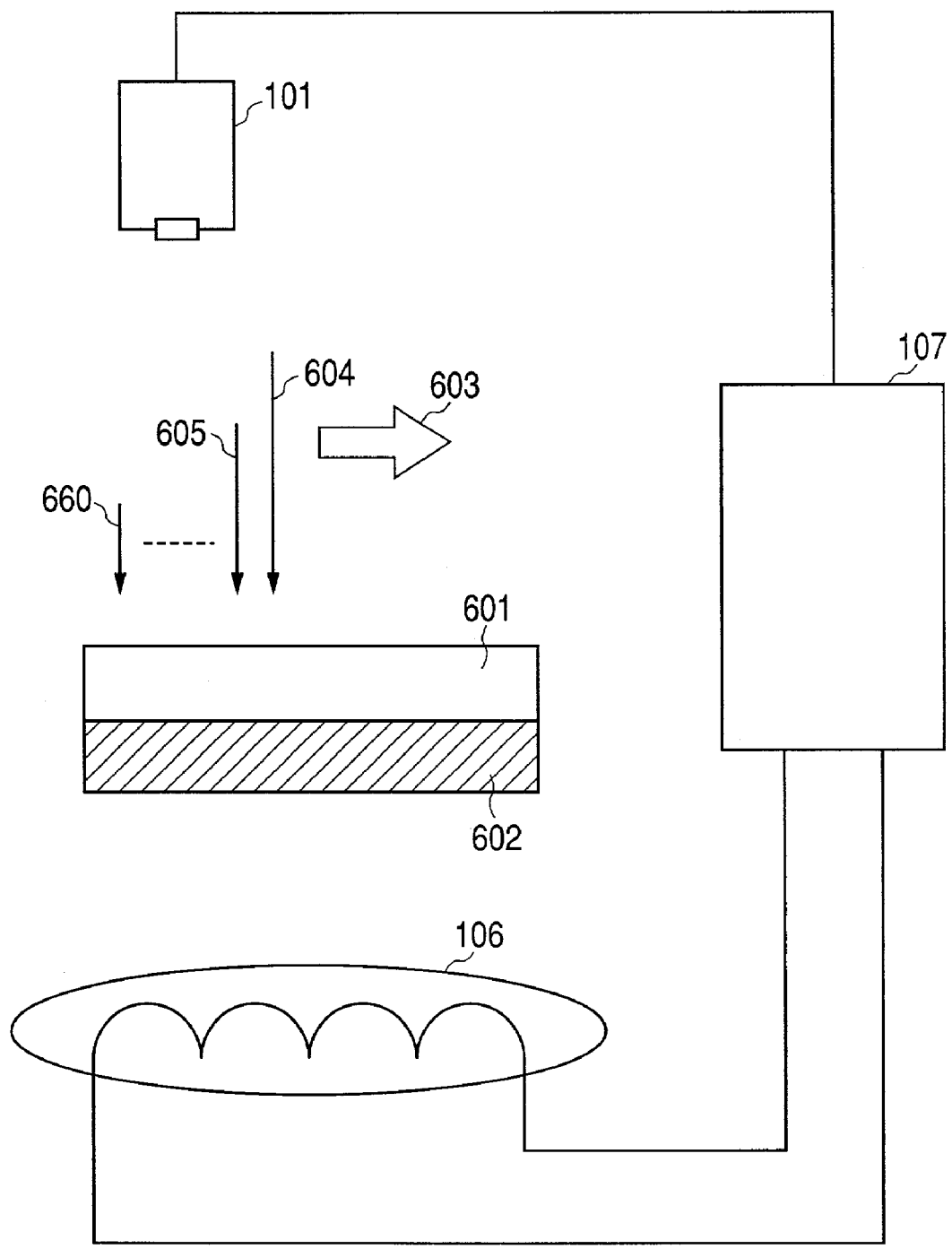
FIG. 1 is a schematic cross sectional view illustrating a state of manufacturing a polycrystalline semiconductor thin film according to an embodiment (Embodiment 1) of the present invention.
Figure 2:
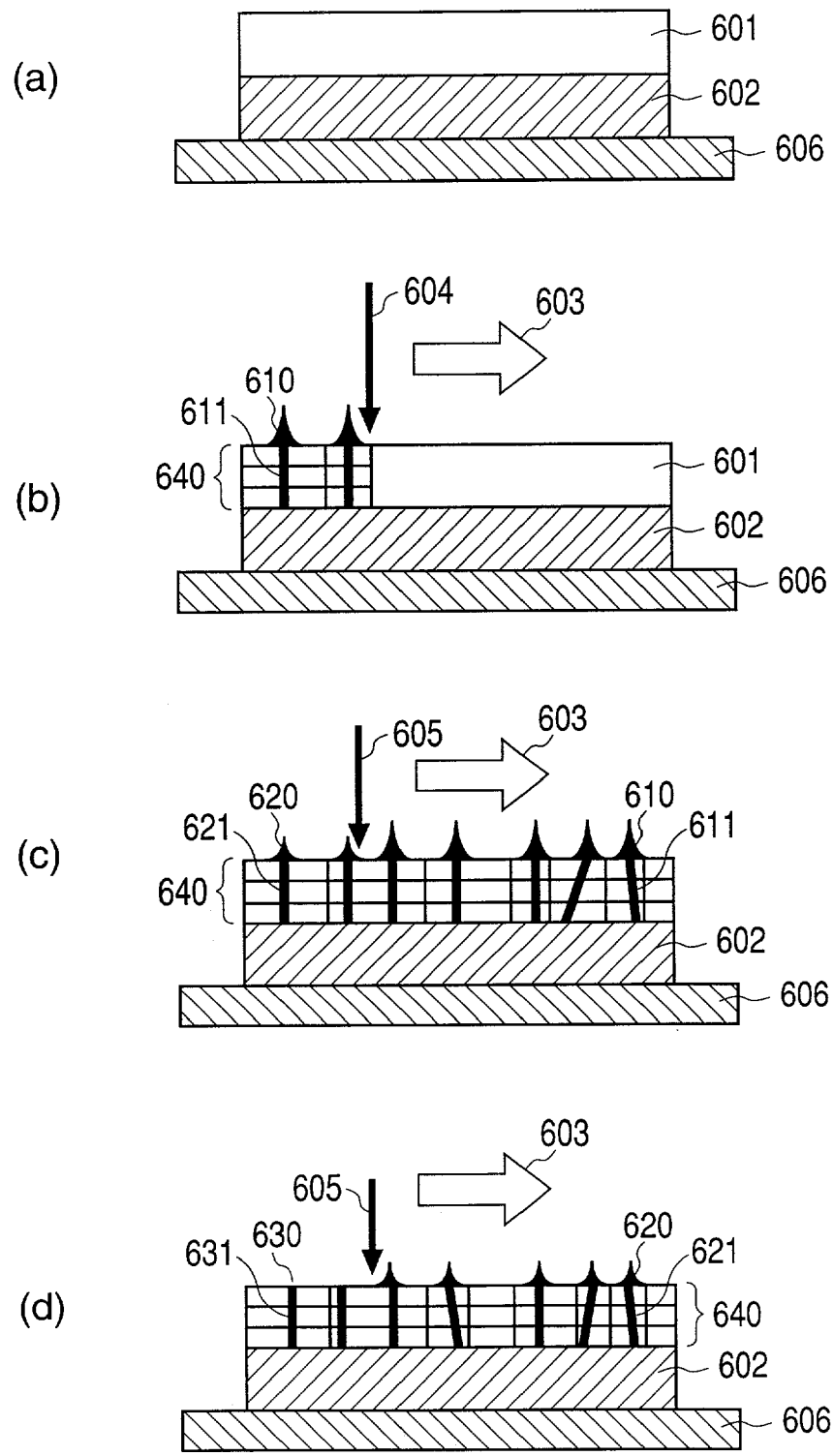
FIG. 2 is a schematic cross sectional view illustrating a method of manufacturing a polycrystalline semiconductor thin film of Embodiment 1.

Hereinafter, preferred embodiments of this invention will be described with reference to the drawings, in which like or corresponding parts are denoted by the same reference characters and the duplicate description thereof will be omitted.

Embodiment 1

Figure 10:
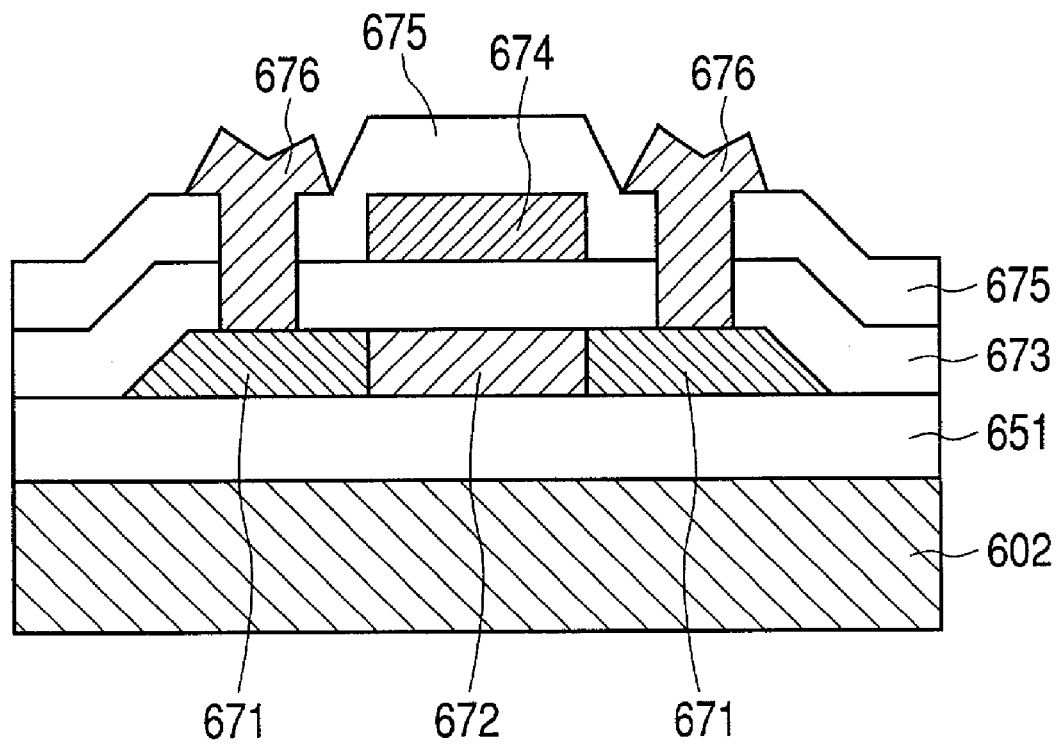
FIG. 10 is a schematic cross sectional view illustrating a transistor (thin film transistor) manufactured according to Embodiment 1.
Figure 11:
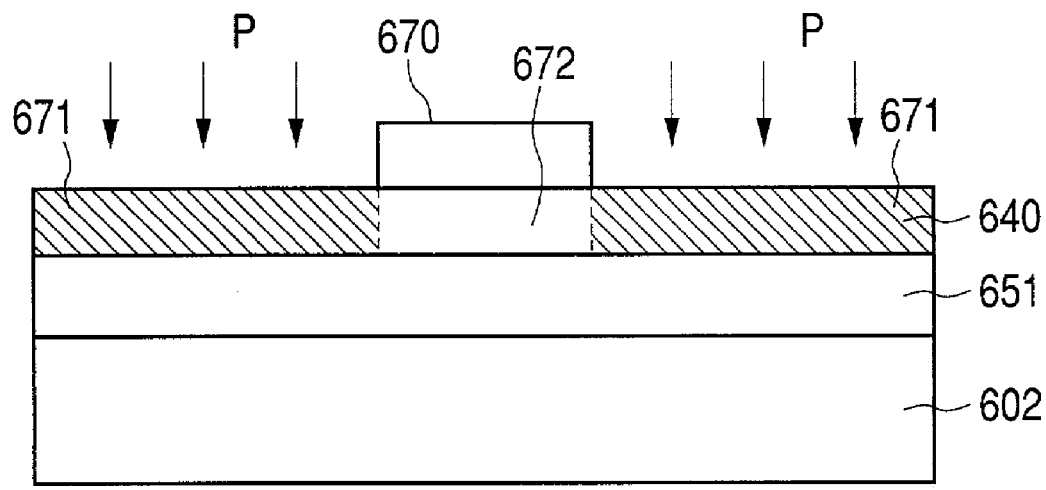
FIG. 11 is a schematic cross sectional view illustrating a method of manufacturing a thin film transistor according to Embodiment 1.
Figure 11:
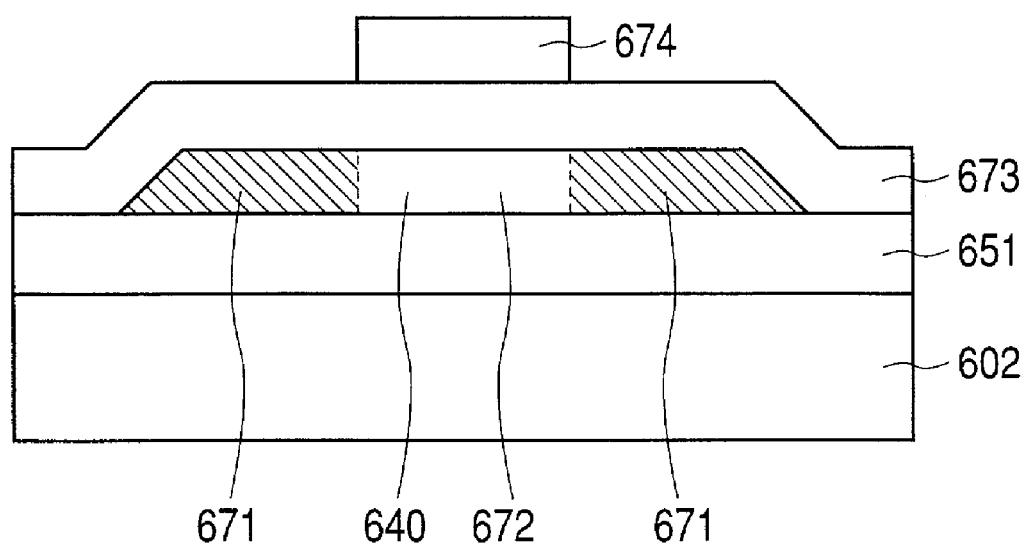

FIG. 1 to FIG. 11 are views concerning the manufacturing technique of a semiconductor device having a thin film transistor as an embodiment (Embodiment 1) of this invention. Particularly, FIG. 1 to FIG. 9 are views concerning the manufacture of a polycrystalline semiconductor thin film substrate and FIG. 10 and FIG. 11 are views illustrating a method of manufacturing a thin film transistor by using the polycrystalline semiconductor thin film substrate.

FIGS. 2(a)-(d) illustrate a method (process) of forming a polycrystalline semiconductor thin film of this Embodiment 1.

At first as shown in FIG. 2(a), an insulative substrate 602 (for example, glass, fused quartz, sapphire, plastic and polyimide) is placed on a heating plate 606 (for example, carbon resistance heating heater). Subsequently, an amorphous semiconductor film 601 (for example, Si, Ge and SiGe) is deposited on the insulative substrate 602 by using a chemical vapor phase deposition method or a sputter deposition method on the insulative substrate 602. The thickness of the amorphous semiconductor film 601 is preferably 60 nm or less.

Then, as shown in FIG. 2(b), the heating plate 606 is heated to a predetermined temperature of 100° C. or higher. In this case, a care should be taken so as not to cause unevenness in the temperature for the insulative substrate 602 and the amorphous semiconductor film 601.

Then, the surface of the amorphous semiconductor film 601 is scanned by a first laser irradiation (first excimer laser irradiation) 604 (for example, KrF or Xecl) in the direction of an arrow 603. The first excimer laser irradiation 604 is applied repeatedly for multiple times at a suitable shape selection laser energy density Ec (360 mJ/cm$^2$), which is to be set as described later. Further, after the first excimer laser irradiation 604, second laser irradiation (second excimer laser irradiation) 605 is applied at a laser energy density lower than the suitable shape selection laser energy density Ec (for example, 320 mJ/cm$^2$). For example, each of the first excimer laser irradiation 604 and the second excimer laser irradiation 605 is applied by the number of 30 to 60 cycles.

Now, the suitable shape selection laser energy density Ec set by the present inventors and the polycrystalline semiconductor thin film formed by the laser beam irradiation are to be explained.

Figure 6:
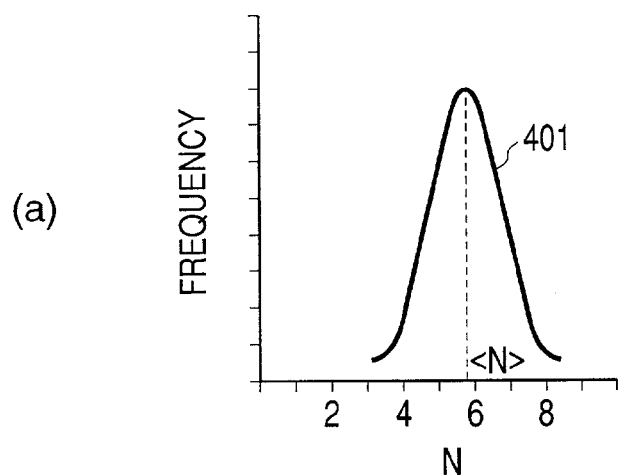
FIG. 6 illustrates a group of graphs showing the result of analysis such as properties of crystal grains and difference in the manufacturing conditions in the manufacture of a polycrystalline semiconductor thin film.
Figure 6:
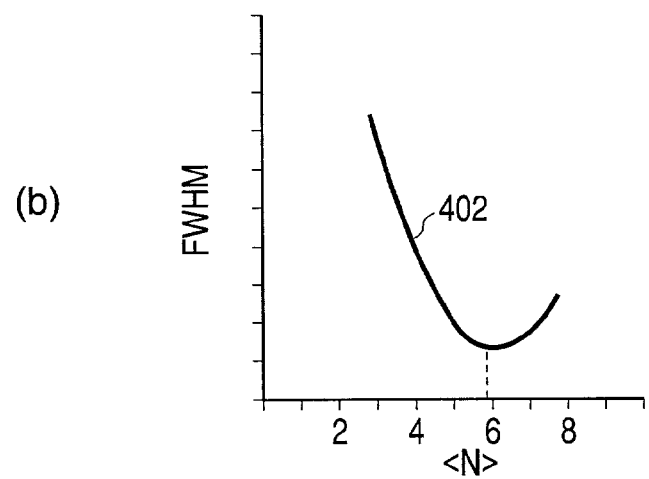
Figure 6:
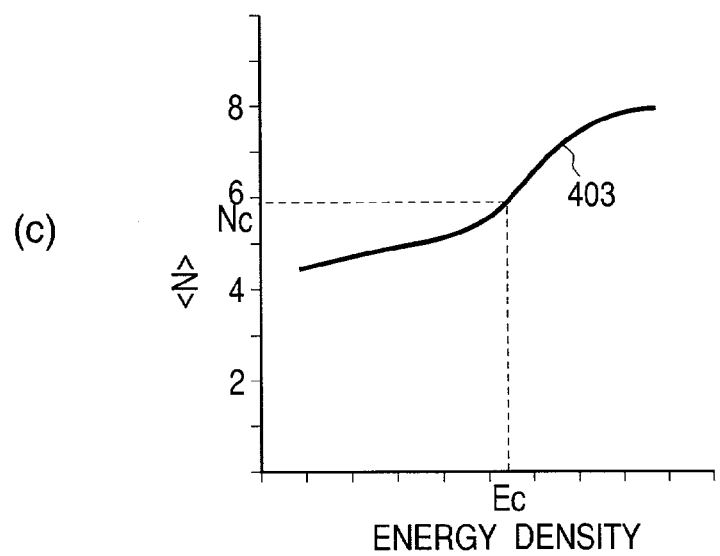

FIG. 6 is a group of graphs showing the result of analysis such as for the properties of the crystal grains and the difference of the manufacturing conditions in the manufacture of a polycrystalline semiconductor thin film, in which FIG. 6(a) is a graph showing a correlation between the shape (N) and the number density of crystal grains, FIG. 6(b) is a graph showing a correlation between (N) and the full width at half maximum and FIG. 6(c) is a graph showing a correlation between the laser energy density and the formed shape (N).

Figure 7:
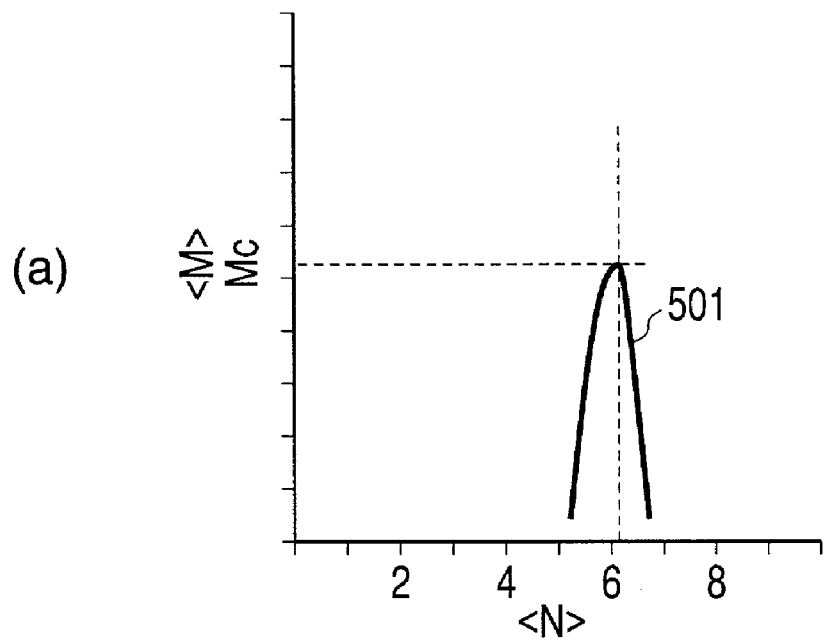
FIG. 7 is a graph showing a correlation between hexagonal crystal grains and the number of cycles of laser beam irradiation in the manufacture of a polycrystalline semiconductor thin film and a graph illustrating a relation between the number of cycles of laser beam irradiation and the roughness on the surface of a polycrystalline semiconductor thin film.
Figure 7:
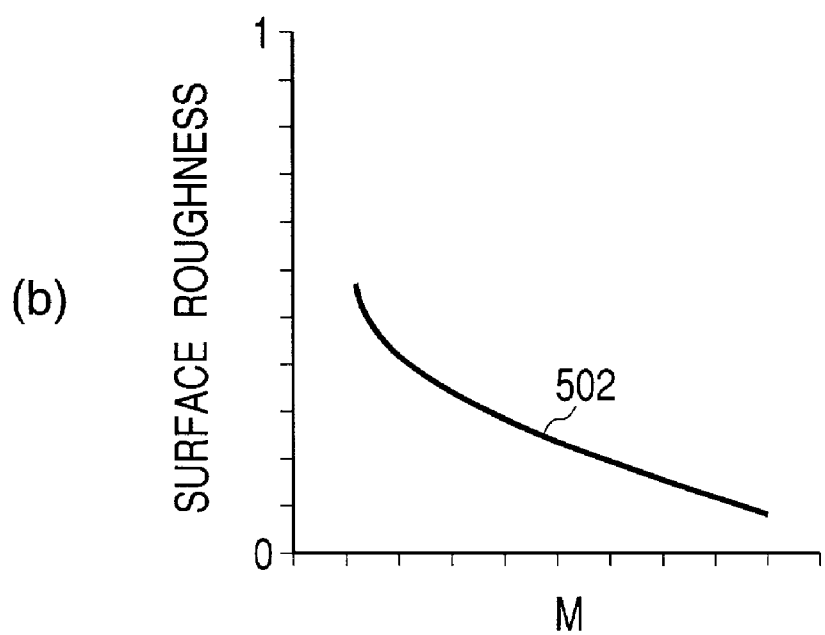

FIG. 7 is a graph showing a correlation between hexagonal crystal grains and the number of laser beam irradiation cycles, and a graph showing a relation between the number of laser beam irradiation cycles and the roughness on the surface of the polycrystalline semiconductor thin film in the manufacture of the polycrystalline semiconductor thin film. Examples of crystal grains according to the existent method of manufacturing a polycrystalline semiconductor thin film by crystallizing an amorphous semiconductor film by laser heating includes trigonal, tetragonal, pentagonal, hexagonal, heptagonal and octagonal shapes as described above. Their distribution is as shown in FIG. 6(a). In the graph N is taken on the abscissa and the number density is taken on the ordinate.

N is a number of closest crystal grains for an optional crystal grain. When the statistical distribution is examined for N, it forms a normal distribution as shown in FIG. 6(a). The full width at half maximum of the normal distribution corresponds to the uniformess of the polycrystalline film in which the polycrystalline film is made more uniform as the full width at half maximum is narrower.

FIG. 6(b) shows a relation between the full width at half maximum and N. The full width at half maximum takes a minimum value at N=6. N=6 is equivalent with the surface shape of the crystal grains (the optional crystal grain) being hexagonal.

FIG. 6(c) illustrates a relation between the laser energy density and N when the amorphous semiconductor film is laser heated at 100° C. or higher. N is 6 when the energy density is Ec. That is, it has been found that the crystal grains tend to form hexagonal crystal grains when the laser energy density is Ec. Then, Ec is defined as the suitable shape selection laser energy density Ec.

FIG. 7(a) illustrates that the optimum number of laser irradiation cycles M is Mc when laser beam irradiation is applied at the laser energy density of Ec or lower at a temperature of the amorphous semiconductor film of 100° C. or higher.

FIG. 7(b) illustrates a relation between the number of laser beam irradiation cycles M and the roughness on the surface of the polycrystalline semiconductor thin film in a case where the laser irradiation (second laser irradiation) is applied at a laser energy density of Ec or lower at a temperature of the amorphous semiconductor film of 100° C. or higher. The roughness is defined as a top-to-bottom maximum length. Specifically, the top-to-bottom length at the corner of the grain boundary corresponds to this. Along with increase in M, the roughness decreases to 5 nm or less. Further, chemical bonds in the grain boundaries are bonded again.

FIGS. 8(a)-(c) is a view illustrating the difference in the shape of crystal grains in the polycrystalline semiconductor film due to the difference of the laser beam density. The view is obtained based on microscopic photography.

Figure 8:
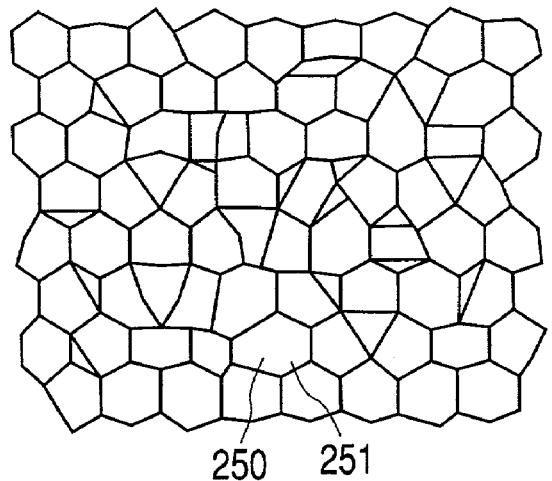
FIG. 8 is a schematic view illustrating the difference of crystal grains depending on the difference in a laser energy density.
Figure 8:
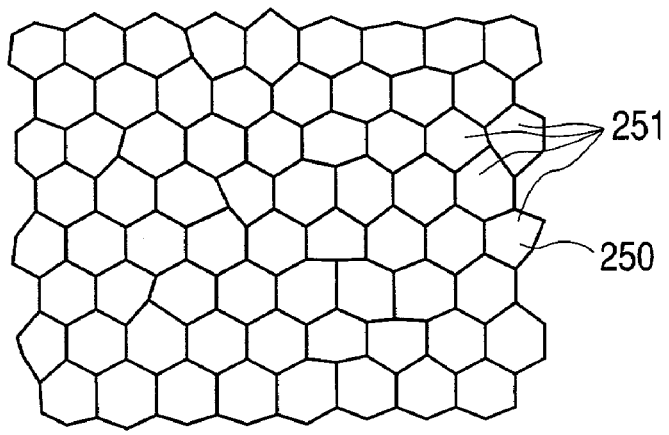
Figure 8:
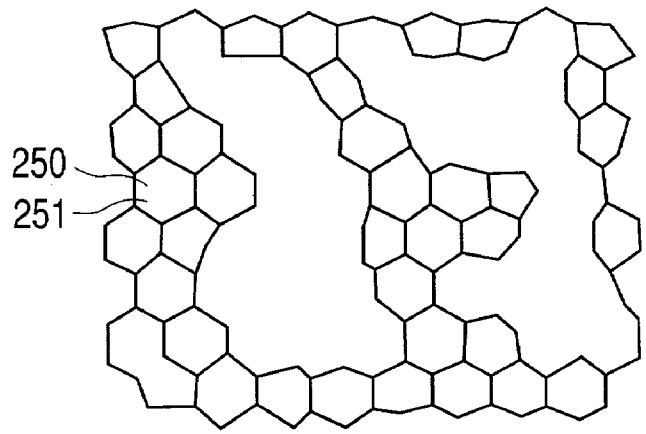
Figure 9:
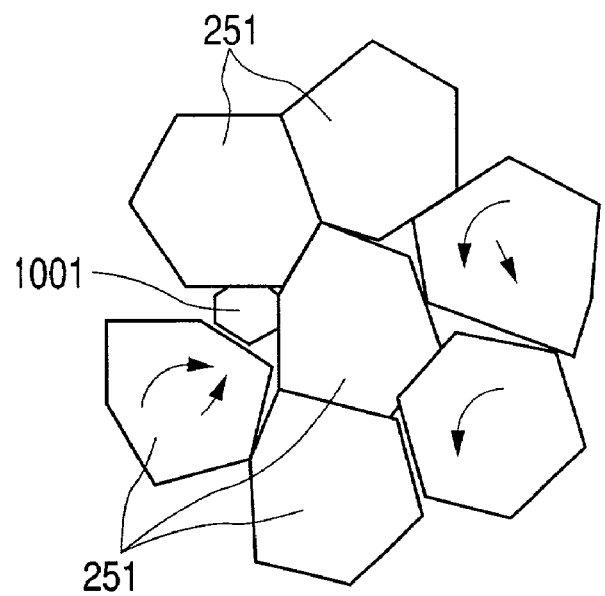
FIG. 9 is a schematic view illustrating the growing process of crystal grains by laser beam irradiation applied repeatedly.
Figure 9:
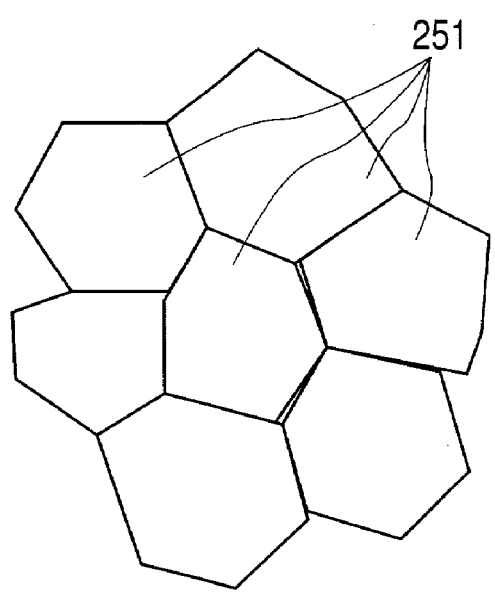

FIG. 8 (a) illustrates the state of crystal grains in the polycrystalline semiconductor film at a laser energy density lower than the suitable shape selection laser energy density Ec. As can be seen from the figure, while crystal grains contain many hexagonal shapes, trigonal, tetragonal or pentagonal shapes are also present. The hexagonal crystal grains are about 30 to 40% or less.

FIG. 8 (b) is an example of forming a polycrystalline semiconductor thin film while applying laser beam irradiation repeatedly at a suitable shape selection laser energy density Ec. This is an example of applying the first laser irradiation at the suitable shape selection laser energy density Ec by multiple cycles and then applying the second laser irradiation at a laser energy density lower than the suitable shape selection laser energy density Ec repeatedly. For example, the laser energy density in the first laser irradiation is 360 mJ/cm$^2$ (suitable shape selection laser energy density Ec) and the laser energy density of the second laser irradiation is 320 mJ/cm$^2$. In this example, the hexagonal crystal grains can be formed by about 50 to 100% by increasing the number of cycles of repeating irradiation. Further, the hexagonal crystal grains are made uniform with a diameter of about 0.2 to 0.3 μm.

It was confirmed that 50 to 100% of the surface shape in the crystal grains constituting the polycrystalline semiconductor thin film is hexagonal, for example, by scanning electron microscopic observation while taking a square evaluation region of 10 μm size on one side including the center of the polycrystalline semiconductor thin film. The result of the observation for the evaluation region reflects the state of the crystal grains for the entire surface of the polycrystalline semiconductor thin film.

In the first laser irradiation, when laser beam irradiation is applied repeatedly by once or a predetermined number of cycles, hexagonal crystal grains are formed successively as crystal grains and, subsequently, they continue to rotate or move as shown in FIG. 9(a) and then respective sides of adjacent hexagonal crystal grains meet each other as shown in FIG. 9(b). Further, according to the laser beam irradiation, less impurities less-segregate to the boundaries of the crystal grain and the carrier concentration of each of the crystal grains becomes constant.

As shown in FIG. 9(a), even when smaller crystal grain 1001 is formed between the hexagonal crystal grains 251, it is joined with large hexagonal crystal grains 251 at the periphery and eliminated in the step of the first laser irradiation and the step of the second irradiation applied repeatedly.

Further, in the second laser irradiation step, laser beam irradiation may be applied successively at the suitable shape selection laser energy density Ec.

FIG. 8(c) is an example of applying the laser beam irradiation at a laser energy density higher than the suitable shape selection laser energy density Ec in which remelting of crystals occurs and grain boundaries are re-bonded into large crystal grains in an island shape.

After the first laser beam irradiation, undulations 610 are formed on the surface of the polycrystalline semiconductor thin film 640 to form grain boundaries 611. The grain boundaries 611 include dangling bonds. Further, as shown in FIGS. 2(b)-(d), the grain boundaries are gradually narrowed as 611, 621 and 631 and the surface roughness is also planarized successively as 610, 620 and 630 along with increase in the number of cycles of the laser beam irradiation.

Figure 3:
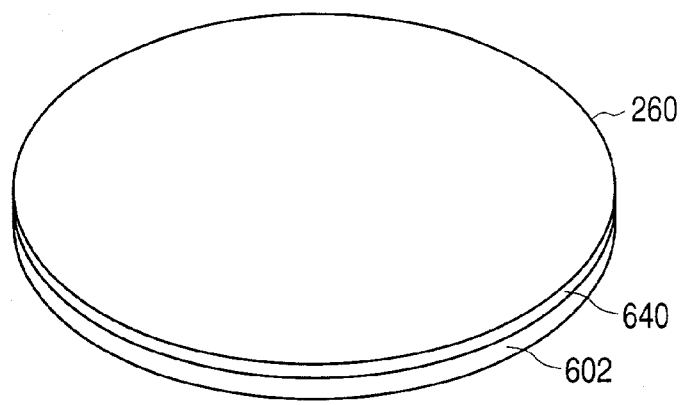
FIG. 3 is a perspective view of a polycrystalline semiconductor thin film substrate of Embodiment 1.
Figure 4:
FIG. 4 is a partial cross sectional view of a polycrystalline semiconductor thin film substrate of Embodiment 1.

By the method as described above, a polycrystalline semiconductor thin film substrate 260 as shown in FIG. 3 can be manufactured. FIG. 4 is a cross sectional view showing a portion of a polycrystalline semiconductor thin film substrate 260.

Figure 5:
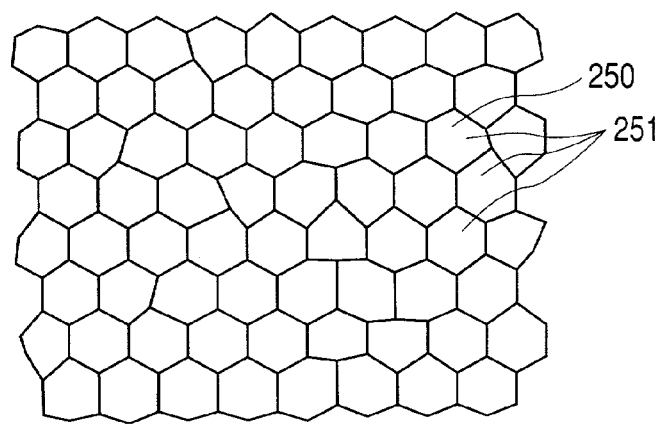
FIG. 5 is a schematic plan view illustrating the constitution of crystal grains in a polycrystalline semiconductor thin film of a polycrystalline semiconductor thin film substrate of Embodiment 1.

As can be seen also from the figure, a polycrystalline semiconductor thin film 640 with a planar surface is formed. Further, most of crystal grains in the polycrystalline semiconductor thin film 640 are also hexagonal crystal grains 251 as shown in FIG. 5. The hexagonal crystal grains 251 can be 50 to 100% depending on the manufacturing method.

The excimer laser irradiation is to be explained with reference to FIG. 1. An excimer laser apparatus has an UV-lamp heating device 106 at a lower portion and has an excimer laser (excimer laser generator) 101 at a corresponding upper portion. The UV-lamp heating device 106 and the excimer laser 101 are controlled by a control device 107.

An insulative substrate (glass substrate) 602 having an amorphous semiconductor film (amorphous silicon film) 601 at the upper surface is disposed on the UV lamp heating device 106 and preliminarily heated by the UV lamp heating device 106. Further, a laser beam (excimer laser beam) 660 is irradiated from the excimer laser 101. Since a not illustrated stage for supporting the insulative substrate 602 is moved relatively to the excimer laser 101, the excimer laser beam 660 can be irradiated to the entire region of the amorphous semiconductor film 601 on the upper surface of the insulative substrate 602 to be formed into a polycrystalline semiconductor thin film.

In this Embodiment 1, the laser beam irradiation is applied for two steps of the first excimer laser irradiation 604 and the second excimer laser irradiation 605. In each of the steps, the laser beam irradiation is applied repeatedly for about 30 to 60 cycles. Further, the laser beam irradiation is applied in the first excimer laser irradiation 604 at the suitable shape selection laser energy density Ec and the laser beam irradiation is applied in the second excimer laser irradiation 605 at a laser energy density lower than the suitable shape selection laser energy density Ec. In the second excimer laser irradiation 605, it may be applied at a constant laser energy density, or the laser beam irradiation may be applied while lowering the laser energy density gradually in the course of irradiation.

According to the method of manufacturing the polycrystalline semiconductor thin film substrate of this Embodiment 1, 50 to 100% of the crystal grains 250 of the polycrystalline semiconductor thin film 640 comprise hexagonal crystal grains 251 and the grain size is uniform as 0.2 to 0.3 µm, so that it is possible to provide a polycrystalline semiconductor thin film substrate with an improved carrier mobility µ and with less variation in the carrier mobility µ in each of the regions. The carrier mobility µ can be enhanced, for example, to about 200-300 $cm^2/V \cdot s$.

Further, since electron orbits in the grain boundaries on the surface and inside the polycrystalline semiconductor thin film are bonded, it can provide an effect of making the carrier mobility constant and improving the reliability of individual transistors.

Further, when the polycrystalline semiconductor thin film 640 is formed, since the laser beam is irradiated repeatedly, the roughness on the surface of the polycrystalline semiconductor thin film 640 is reduced and a planar polycrystalline semiconductor thin film substrate can be provided. For example, the roughness can be restricted to 5 nm or less.

Further, when the polycrystalline semiconductor thin film 640 is formed, since the laser beam irradiation is applied repeatedly for multiple cycles at the suitable shape selection laser energy density Ec most preferred for forming the hexagonal shape, hexagonal seed crystals are successively formed in the amorphous semiconductor film and adjacent hexagonal crystal grains move to each other and are successively in close contact with adjacent hexagonal crystal grains 251. Subsequently, since the laser beam irradiation is applied repeatedly for multiple cycles at a laser energy density lower than the suitable shape selection laser energy density Ec, less impurities segregate to the grain boundary and the carrier concentration is made constant for each of the crystal grains.

The atmosphere upon UV-lamp heating and laser heating in this embodiment may be vacuum, inert gas (for example, argon, krypton or helium) or nitrogen gas.

Then, a method of manufacturing a thin film transistor is to be explained. For example, as shown in FIG. 11(a), an insulative substrate (glass substrate) 602 having a polycrystalline semiconductor thin film (polycrystalline silicon film) 640 at the surface is provided. The example of FIG. 11 has a structure in which a silicon oxide film 651 is placed as a buffer layer between the insulative substrate 602 and the polycrystalline semiconductor thin film 640, different from the polycrystalline semiconductor thin film substrate 260 shown in FIG. 3. While the buffer layer may be omitted, this Embodiment 1 is to be explained for the method of manufacturing a thin film transistor in a polycrystalline semiconductor thin film substrate 260 having the buffer layer.

As shown in FIG. 11(a), a photoresist film 670 is disposed selectively for forming a channel region 672 of the transistor and, subsequently, phosphorus (P) is implanted into the polycrystalline semiconductor thin film 640 and annealing is applied to form an n-type impurity region 671. The impurity region 671 forms a source region or a drain region. If necessary, predetermined impurities are doped to the polycrystalline semiconductor thin film 640 in the step of forming the polycrystalline semiconductor thin film.

Then, as shown in FIG. 11(*b*), selective etching is applied to extend impurity regions 671 each of a predetermined length on both sides of the channel region 672.

Then, as shown in FIG. 11(*b*), a silicon oxide film is formed over the entire region on the upper surface of the insulative substrate 602 to form a gate insulation film 673.

Than, as shown in FIG. 11(*b*), a gate 674 is formed above the channel region 672.

Alternatively, the impurity regions 671 to form the source region and the drain region may be formed by disposing a gate insulation film 673 and forming a gate electrode 674 and then implanting phosphorus into the polycrystalline semiconductor thin film 640 using the gate electrode 674 as a mask without conducting the impurity diffusion as described above.

Then, as shown in FIG. 10, after forming an interlayer insulation film 675 over the entire region of the upper surface of the insulative substrate 602, contact holes are opened to form electrodes (source electrode, drain electrode) 676 to be connected with the impurity region 671 or not illustrated gate wiring electrode. Further, although not illustrated, the transistor is covered with a passivation film and a portion of the passivation film is removed to expose an external electrode.

While only one transistor is illustrated in the figure, it is actually formed in plurality.

In the transistor according to this Embodiment 1, 50% to 100% of the crystal grains of the polycrystalline semiconductor thin film 640 comprise hexagonal crystal grains 251 and the grain diameter is uniform as 0.2 to 0.3 μm. Accordingly, when a transistor (TFT) is formed, the grain boundaries in the channel region of silicon below the gate electrode are reduced and the carrier mobility μ is improved and variation in the carrier mobility is decreased for each of the transistors. The carrier mobility μ can be enhanced, for example, to about 200-300 cm$^2$N·s.

Further, the variation in the density of the grain boundaries present in the channel region of silicon below the gate electrode is reduced in each of the transistors, and the threshold voltage $V_{th}$ is made uniform for each of the transistors. Variation in the threshold voltage $V_{th}$ can be suppressed to 0.1 V or lower.

Further, since the laser beam is irradiated repeatedly when the polycrystalline semiconductor thin film 640 is formed, the roughness on the surface of the polycrystalline semiconductor thin film is reduced, and variation in the performance is decreased for each of the individual transistors and less degradation occurs to attain longer life of the transistor.

Further, when the polycrystalline semiconductor thin film 640 is formed, since the laser beam irradiation is applied repeatedly by multiple cycles at a suitable shape selection laser energy density Ec for forming the hexagonal shape, hexagonal seed crystals are formed successively and adjacent hexagonal crystal grains move to each other and are in close contact with adjacent hexagonal crystal grains successively. Subsequently, laser beam irradiation is applied repeatedly for multiple cycles at a laser energy density lower than the suitable shape selection laser energy density Ec. Accordingly, less impurities segregate in the grain boundaries and the carrier concentrations are made constant for each of the crystal grains. As a result, characteristics of the transistor become stable.

Further, since crystal grains of uniform shape and size are formed in the transistor channel region and chemical bonds of the grain boundaries are re-bonded to provide a surface with less roughness, the interface density of state between the semiconductor and the gate insulation film can be lowered to lower the threshold voltage $V_{th}$. Further, by the same reasons as described above, variation due to short-channel can be suppressed.

In this embodiment, since the crystal grains in the polycrystalline semiconductor thin film are formed as the hexagonal crystal grains of uniform size, the carrier mobility is high and it varies less and the threshold voltage $V_{th}$ varies less. Accordingly, when plural transistors are manufactured, characteristics scatter less for each of the transistors and the manufacturing yield of semiconductor devices can be improved. As a result, the manufacturing cost of the semiconductor device can be reduced.

Embodiment 2

Figure 12:
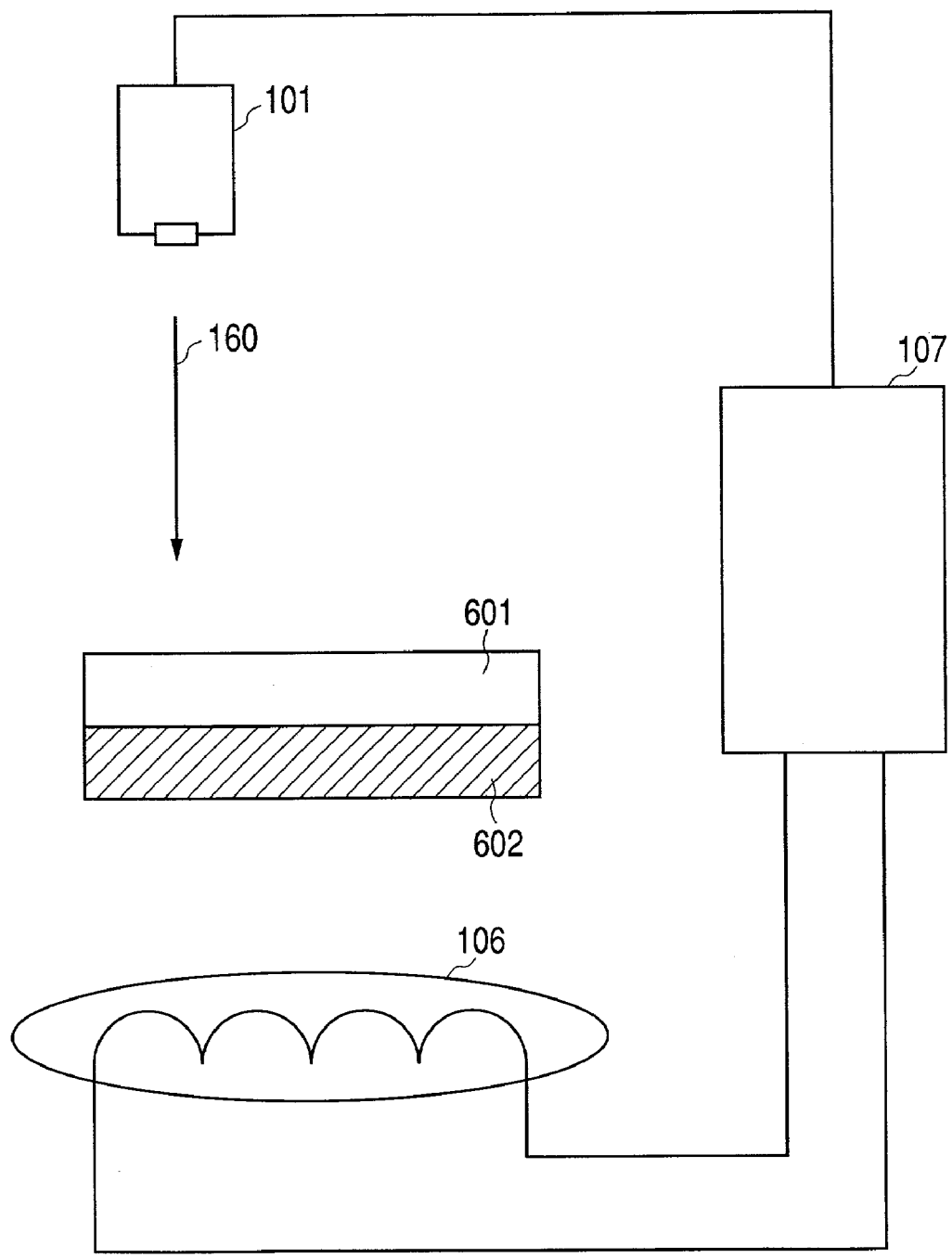
FIG. 12 is a schematic cross sectional view illustrating the state of manufacturing a polycrystalline semiconductor thin film according to another embodiment (Embodiment 2) of the present invention.

FIG. 12 is a schematic view illustrating the state of forming a polycrystalline semiconductor thin film as another embodiment (Embodiment 2) of this invention.

In the excimer laser device of Embodiment 2, as shown in FIG. 12, an insulative substrate (glass substrate) 602 having an amorphous semiconductor film (amorphous silicon film) 601 at the upper surface is located between a UV-lamp heating device 106 in the lower portion and an excimer laser (excimer laser generator) 101 in the upper portion, and the UV-lamp heating device 106 and the excimer laser 101 are controlled by the control device 107. Preliminary heating is applied by the UV-lamp heating device 106 and the amorphous semiconductor film 601 is formed into a polycrystalline semiconductor thin film by a laser beam 160 emitted from the excimer laser 101.

In Embodiment 2, the UV-lamp heating device 106 and the excimer laser 101 are controlled by using the control device 107 to synchronize the light emitting interval of the UV-rays and the excimer laser irradiation. In this case, thermally-induced strain formed between the insulative substrate 602 and the amorphous semiconductor film 601 can be controlled.

Embodiment 3

Figure 13:
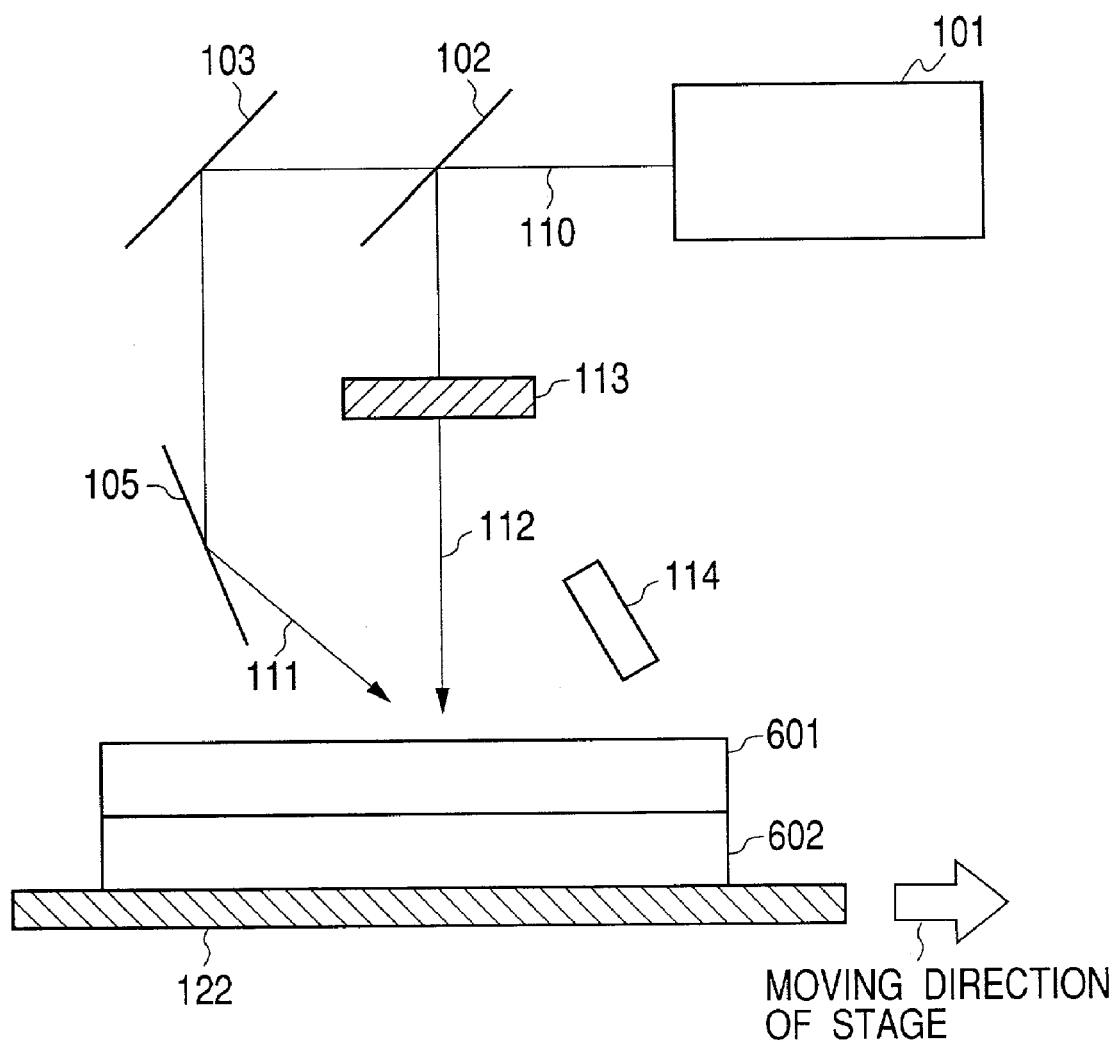
FIG. 13 is a schematic cross sectional view illustrating the state of manufacturing a polycrystalline semiconductor thin film according to another embodiment (Embodiment 3) of the present invention.

FIG. 13 is a schematic view illustrating the state of forming a polycrystalline semiconductor thin film as another embodiment (Embodiment 3) of this invention. Explanation is to be made, particularly, for the constitution of the excimer laser beam irradiation in FIG. 3.

A laser beam 110 emitted from an excimer laser 101 is irradiated to an amorphous semiconductor film 601 at the upper surface of an insulative substrate 602 placed on a sample stage 122. In this Embodiment 3, the laser beam 110 emitted from the excimer laser 101 splits in two optical channels by an optical component such that one of them reaches a laser beam irradiation position with a delay.

That is, the laser beam 110 emitted from the excimer laser 101 is divided by a half mirror 102 into two optical channels in which one of them passes through a mirror 103 and a mirror 105 and reaches a laser beam irradiation position, while the other is reflected at the half mirror 102 and then directly reaches the laser beam irradiation position.

With this constitution, a laser beam 112 passing through an optical channel of a shorter optical channel length can preliminarily heat the amorphous semiconductor film 601 and melts the amorphous semiconductor film 601 together with a laser beam 111 that reaches passing through an optical channel of a longer optical channel length with a delay.

Then, laser beam irradiation is applied repeatedly for multiple cycles at the suitable shape selection laser energy density Ec as the first laser irradiation step and, successively, the laser beam irradiation is applied repeatedly for multiple cycles at a laser energy density lower than the suitable shape selection laser energy density Ec as the second laser irradiation step, thereby enabling to manufacture a polycrystalline semiconductor thin film substrate at a good quality in the same manner as in the previous embodiments.

Embodiment 4

In Embodiment 4, an electronic apparatus incorporated with a transistor (thin film transistor) manufactured by the previous embodiment will be described.

Figure 14:
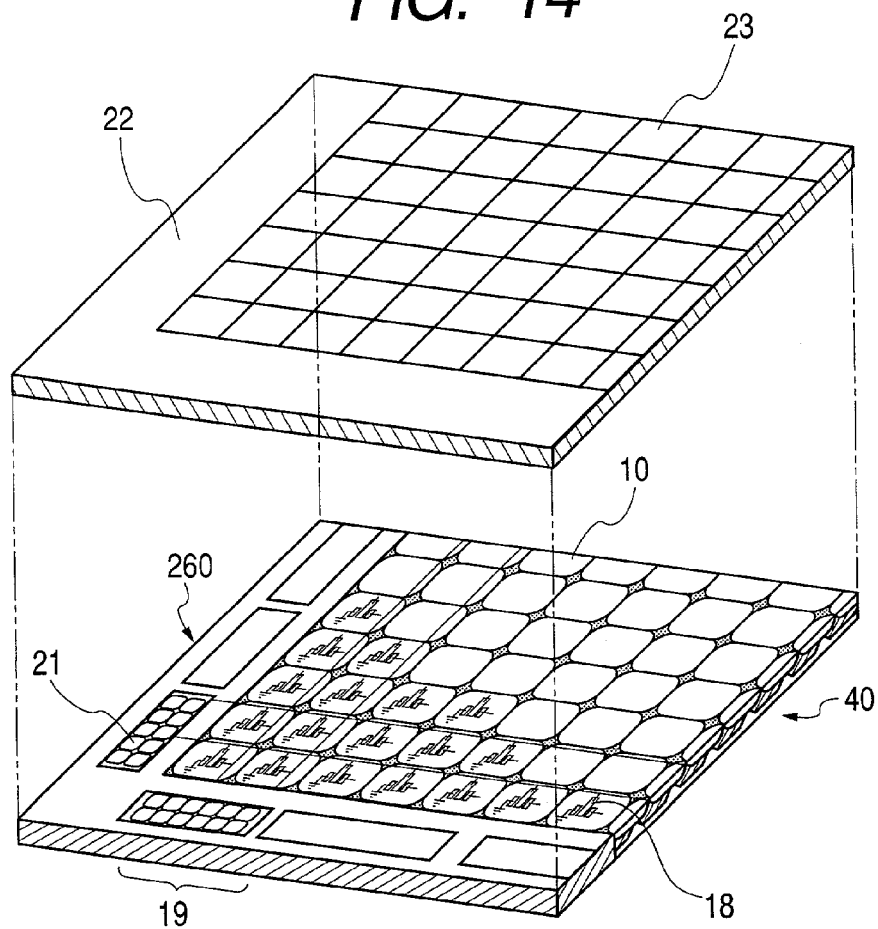
FIG. 14 is a schematic perspective view illustrating a portion of a liquid crystal display according to another embodiment (Embodiment 4) of the present invention.

FIG. 14 is a schematic perspective view illustrating a portion of a liquid crystal display according to another embodiment (Embodiment 4) of the present invention.

Explanation is to be made in this Embodiment 4 to an example of incorporating a semiconductor device 40 formed with plural transistors (thin film transistors) 18 to a polycrystalline semiconductor thin film substrate 260 (amorphous semiconductor film 601 formed on the upper surface of the insulative substrate 602) into an image display apparatus (electronic apparatus).

FIG. 14 is a perspective view in an exploded state illustrating a portion of the image display apparatus. As shown in FIG. 14, it is constituted such that liquid crystals are disposed on a semiconductor device 40 in which a group of transistors are formed to the upper surface of a polycrystalline semiconductor thin film substrate 260 and a display panel 22 constituting pixels 23 is stacked and glass-encapsulated. Transistors 18 as the pixel driver correspond to each of the pixels 23, and the source electrode of the transistor 18 and the pixel electrode of the pixel 23 are connected to each other by stacking.

Peripheral driver circuits 19 such as an address decoder, a digital/analog conversion circuit and a controller are disposed to the periphery out of the region in which the pixels 23 are arranged. Reference numerals 10 and 21 show transistor forming regions.

In the electronic apparatus described above, since the size of the crystal grains is uniform in the channel region of each of the transistors 18 corresponding to the pixel 23, the carrier mobility is constant and the threshold voltage $V_{th}$ is also constant as described in Embodiment 1, image display at high performance is possible and reliability can be improved in an image display of a large area.

Embodiment 5

Figure 15:
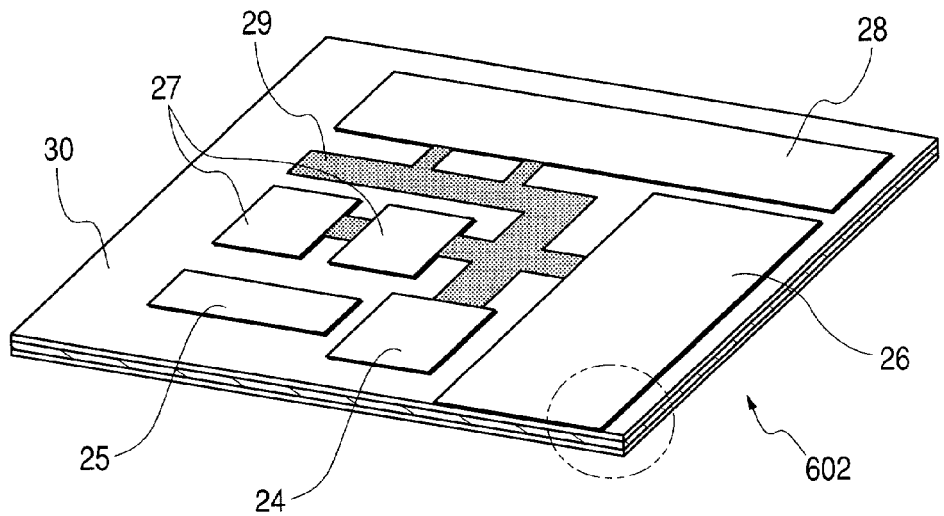
FIG. 15 is a schematic perspective view illustrating a portion of a data processor according to another embodiment (Embodiment 5) of the present invention.
Figure 16:
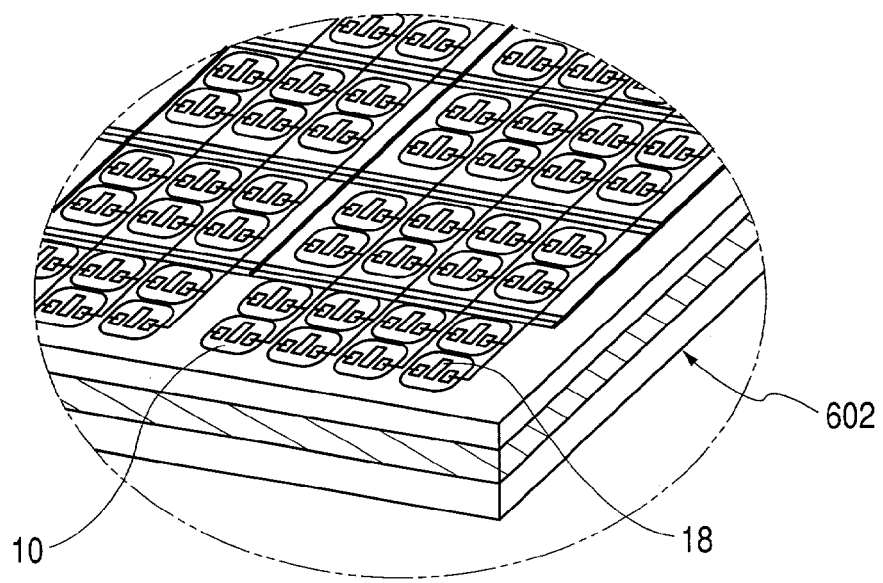
FIG. 16 is an enlarged schematic view of a portion surrounded with a dotted chain in FIG. 15.
Figure 17:
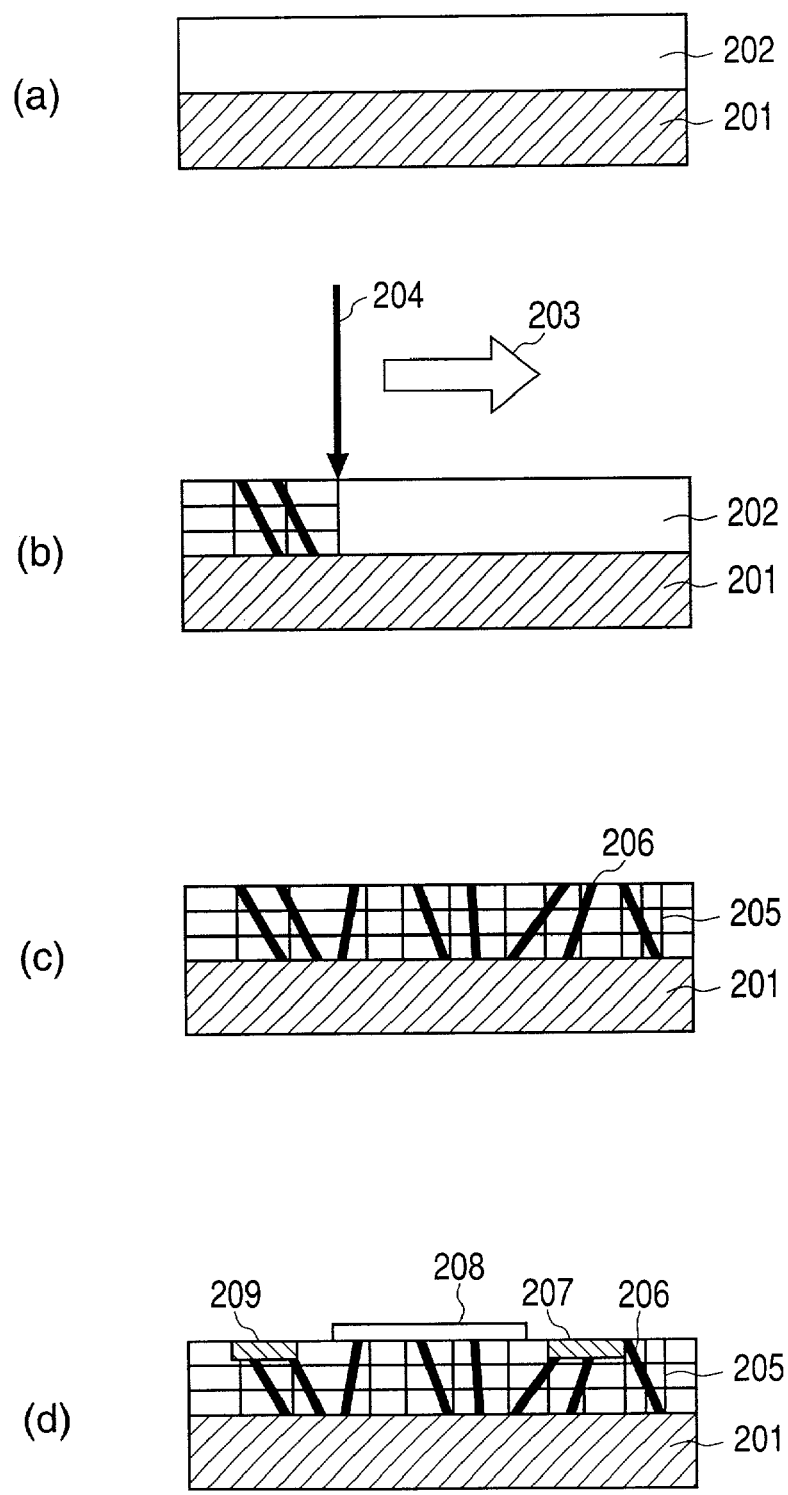
FIG. 17 is a schematic cross sectional view illustrating an existent method of manufacturing a thin film transistor.
Figure 18:
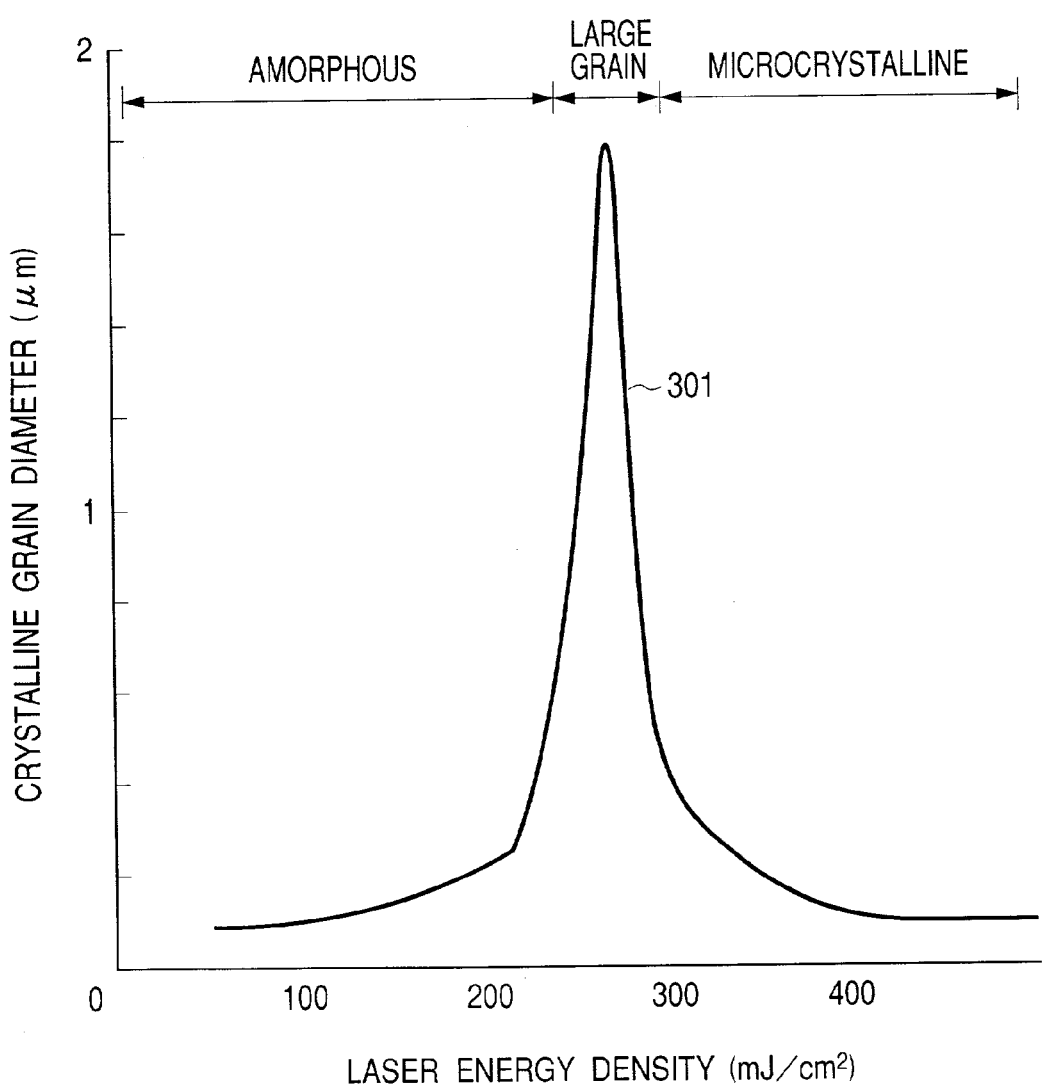
FIG. 18 is a diagram illustrating a correlation between the laser energy density and the crystal grain diameter in the prior art.
Figure 19:
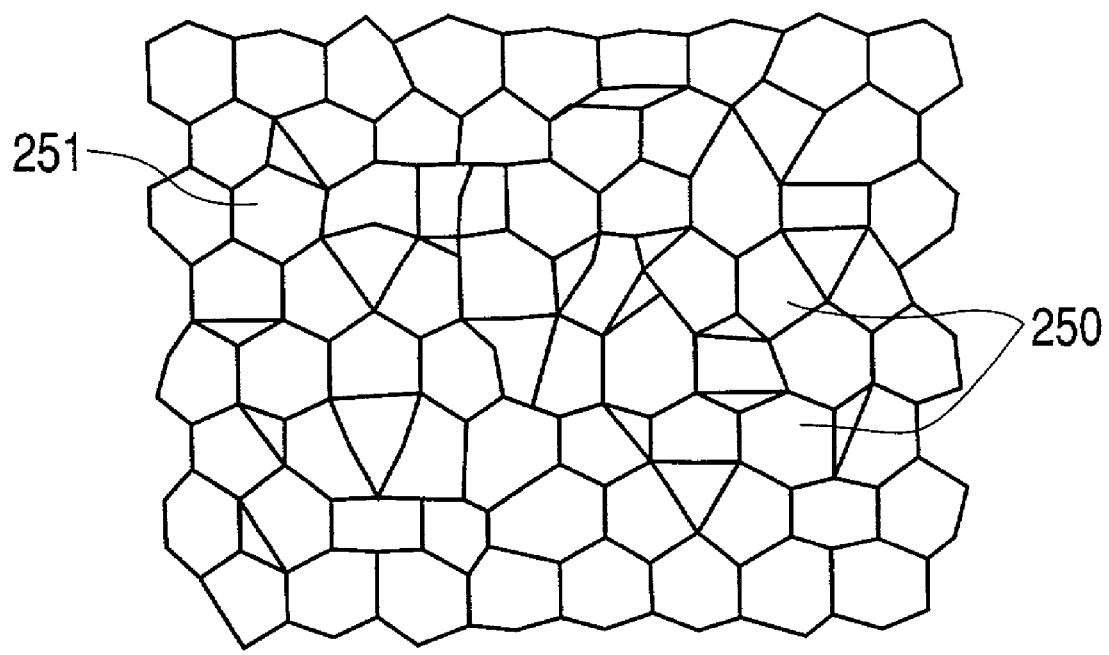
FIG. 19 is a schematic view illustrating a constitution of crystal grains of a polycrystalline semiconductor thin film in an existent polycrystalline semiconductor thin film substrate.

FIG. 15 is a schematic perspective view illustrating a portion of a data processor according to another embodiment (Embodiment 5) of this invention and FIG. 16 is an enlarged schematic view of a portion surrounded with a dotted chain circle in FIG. 16.

Also in this Embodiment 5, crystal grains to be used are formed on the surface of an insulative substrate 602, that is, a glass substrate to form a polycrystalline semiconductor thin film substrate 260 by the same method as in Embodiment 1.

A data processor 30 comprises each of circuitries formed on the surface of a polycrystalline semiconductor thin film substrate 260. That is, as shown in FIG. 15, transistors 18 and passive elements not shown are formed on the surface of the polycrystalline semiconductor thin film substrate 260. Further, each of the circuitries is connected with wirings not shown and has such a structure in which external terminals are disposed on the surface of the polycrystalline semiconductor thin film substrate 260 or connectors are attached to the edges thereof.

Further, each of the circuit portions and wirings on the surface of the polycrystalline semiconductor thin film substrate are covered and protected with a passivation film. Reference numeral 10 denotes a transistor film region.

The data processor 30 comprises, for example, a central processing unit 24, a memory circuitry 26, an input/output controller 28 and a peripheral circuitry 27 connected respectively by way of a data bus circuitry 29 to the central processing unit 24, and a cash circuitry 25 connected with the central processing unit 24.

In the data processor 30, each of the transistors is formed into a polycrystalline semiconductor thin film. Since each of the transistors is formed as a polycrystalline semiconductor thin film with the uniform size of the crystal grains and with uniform grain boundaries in the channel region, the carrier mobility μ is high with less variation and also the variation in the threshold voltage $V_{th}$ is small.

Accordingly, the electric field effect mobility is higher than that formed in the existent polycrystal semiconductor thin film and the manufacturing cost of the data processor 30 can also be reduced.

The inventions made by the present inventors have been explained concretely with reference to the preferred embodiments but it will be apparent that the inventions are not limited to the embodiments described above and can be modified variously within a scope not departing the gist thereof.

Further, in the foregoing explanations, although the inventions made by the present inventors have been described in the case where the invention is applied to the image display or the data processor in the field of use as the background of the invention, it is not limited thereto and is applicable also to other electronic devices.

These inventions are applicable at least to electronic devices that can be manufactured by using the polycrystalline semiconductor thin film.

The effects obtainable by typical inventions among those disclosed in the present application will be simply explained as below.

(1) In the polycrystalline semiconductor thin film substrate, the crystal grains of the polycrystalline semiconductor thin film can be formed into the hexagonal crystal grains of a uniform size and the ratio of the hexagonal crystal grains can be 50 to 100%.

(2) In the polycrystalline semiconductor thin film substrate, it is possible to provide the polycrystalline semiconductor thin film substrate in which the size and the carrier concentration are uniform and the surface is planar.

(3) A semiconductor device having the thin film transistor of favorable characteristics and with less variation in characteristics can be provided.

(4) A semiconductor device having the thin film transistor of high carrier mobility and with less variation in characteristics can be provided.

(5) The yield of the semiconductor devices can be enhanced and reduction in the manufacturing cost for the semiconductor device can be attained.

(6) Electronic apparatus such as a liquid crystal display and a data processing unit at favorable high speed performance can be provided.

The invention claimed is:

1. A semiconductor device comprising plural transistors formed in a polycrystalline semiconductor thin film, wherein the polycrystalline semiconductor thin film is formed by a plurality of laser irradiation steps, wherein the laser irradiation steps are carried out so that, after the last laser irradiation step, the number of crystal grains with the number of closest crystal grains of 6 is greatest among plural crystal grains that form the polycrystalline semiconductor thin film.

2. A semiconductor device as defined in claim 1, wherein the roughness of the grain boundaries on the surface of the polycrystalline semiconductor thin film is 5 nm or less.

3. A semiconductor device comprising plural transistors formed in a polycrystalline semiconductor thin film, wherein the polycrystalline semiconductor thin film is formed by a plurality of laser irradiation steps, wherein the laser irradiation steps are carried out so that, after the last laser irradiation step, the number of crystal grains with the number of closest crystal grains of 6 is greatest among plural and non-uniformly oriented crystal grains that form the polycrystalline semiconductor thin film.

4. A semiconductor device a defined in claim 3, the roughness of the grain boundaries on the surface of the polycrystalline semiconductor thin film is 5 nm or less.

5. A semiconductor device as claimed in claim 3, wherein the crystalline orientations are independent of the shape of crystalline surfaces of the plural crystal grains that form the polycrystalline semiconductor thin film.

6. A semiconductor device as claimed in claim 1, wherein the plural crystal grains that form the polycrystalline semiconductor thin film have crystalline orientations independent of the crystalline surface shapes.

* * * * *